United States Patent [19]

Nomura et al.

[11] Patent Number: 4,602,192
[45] Date of Patent: Jul. 22, 1986

[54] THIN FILM INTEGRATED DEVICE

[75] Inventors: Koji Nomura, Neyagawa; Hisahito Ogawa, Nara; Atsushi Abe, Ikoma; Tsuneharu Nitta, Katano, all of Japan

[73] Assignee: Matsushita Electric Industrial Co., Ltd., Osaka, Japan

[21] Appl. No.: 678,547
[22] PCT Filed: Mar. 29, 1984
[86] PCT No.: PCT/JP84/00145
    § 371 Date: Nov. 27, 1984
    § 102(e) Date: Nov. 27, 1984
[87] PCT Pub. No.: WO84/03992
    PCT Pub. Date: Oct. 11, 1984

[30] Foreign Application Priority Data

Mar. 31, 1983 [JP] Japan .................................. 58-57552
Jun. 2, 1983 [JP] Japan .................................. 58-98343

[51] Int. Cl.$^4$ ............................................... G09G 3/10
[52] U.S. Cl. ............................. 315/169.3; 357/23.15; 357/41; 357/52
[58] Field of Search ................... 357/41, 23.15, 52; 315/169.3

[56] References Cited

U.S. PATENT DOCUMENTS 3,556,966 1/1971 Waxman et al. ............... 357/23.15
3,663,870 5/1972 Tsutsumi et al. .............. 357/23.15
3,690,945 9/1972 Kuisl .............................. 357/23.15
3,878,549 4/1975 Yamazaki et al. .................. 357/41

Primary Examiner—Harold Dixon
Attorney, Agent, or Firm—Spencer & Frank

[57] ABSTRACT

In a thin film integrated device wherein thin film elements, such as thin film condensers, thin film field effect type transistors and thin film electroluminescent elements, which include insulating films (3, 7, 13, 15, 16) as one of their constitution elements, are formed on an insulating substrate; the insulating films are made of sputtered composite oxide films with at least tantalum and aluminum as major constituents. Since this sputtered composite oxide film has characteristics with a large dielectric constant and a breakdown field intensity and a small leakage current, if it is applied in the thin film elements, their operation characteristics can be increased and their reliability can be remarkably improved.

14 Claims, 10 Drawing Figures

THIN FILM INTEGRATED DEVICE

TECHNICAL FIELD

This invention relates to a thin film integrated device wherein a plurality of thin film condensers, thin film transistors, and thin film light emitting elements, etc. are integrated and more particularly to a thin film integrated device which can improve the reliability by using a novel composite oxide thin film formed by the sputtering method.

BACKGROUND ART

Many materials are known as oxide films used for thin film elements in thin film integrated devices, which are formed by oxidization through the anodic oxidation of a metal thin film layer of tantalum, titanium or aluminum, etc. capable of anodic formation formed by the sputtering or the vacuum evaporation method; or by reactive sputtering of the metal in an inert gas containing oxygen; or by directly sputtering the oxides of the above metals in an inert gas.

These oxide films often play a basic role of the function of the thin film elements. The characteristics of the oxide films themselves influence the qualities of those of the respective thin film elements. For example, in thin film condensers, anodic oxidation films of tantalum, aluminum, etc. are well known.

Recently, a method of forming a hybrid integrated circuit comprising thin film resistors and thin film condensers has been intensively studied, according to which a thin film alloy of tantalum and aluminum, occasionally doped with nitrogen, is formed by a sputtering method and a part of the film is anodic oxidized (see for example Thin Solid Films, 109 (1983) 339–343). However, the manufacturing process using the anodic oxidation method is not only complicated, but also inevitably needs the provision of current paths for the anodic formation. When the method is applied to the thin film integrated devices, integration is difficult because the freedom of designing a pattern is limited.

The above-mentioned thin film of tantalum-aluminium alloy has a high resistivity. When a thin film condenser is formed by anodic oxidation, the dielectric loss (tan δ) becomes large at high frequencies and the usable frequency band is reduced. Furthermore, since the interface between the anodic oxidation film and the electrode does not become perfect oxide, the breakdown field intensity (Eb) of the condenser becomes small. On the other hand, tantalum oxide formed by the sputtering method has many pinholes and hence the leakage current is large. Since the breakdown field intensity Eb is also low (about $1.5 \times 10^6$ V.cm$^{-1}$), the film thickness should be made large. This makes it difficult to obtain a large capacitance element. Even aluminum oxide formed by the sputtering method has a small dielectric constant ($\epsilon r$) and cannot form a large capacitance element.

Thin film transistars have been intensively studied as a driver for liquid crystals and EL display devices, etc., in which an on-off ratios of current is desired. For this purpose, the gate oxide film should have a large dielectric constant ($\epsilon r$) to increase the mutual conductance (gm) and a small leakage current to decrease the off-current. Furthermore, in order to obtain a thin film transistor with a stable characteristic, it is desirable that the characteristics of the interface between the semiconductor layer and the gate oxide film are good.

The thin film light emitting element is represented by a thin film EL (electroluminescence) element using a ZnS:Mn emission layer. The field intensity for obtaining the EL emission is high, about $10^6 \text{Vcm}^{-1}$. An EL thin film element with a high brightness is desired, in which the electric field is applied efficiently to the emission layer and which has a low threshold voltage for light emission and can operate with a low voltage. For this purpose, it is required that the oxide film provided on the both sides or on one side of the emission layer has a large dielectric constant ($\epsilon r$), a high breakdown voltage and a low leakage current.

An EL display device of matrix type is constituted with thin film EL elements, thin film transistors and thin film condensers, etc. Therefore, in order to increase the reliability, the oxide films used in these elements should have the above-mentioned characteristics. This is also the case with a liquid crystal display device of matrix type.

DISCLOSURE OF INVENTION

This invention provides a thin film integrated device using a sputtered composite oxide thin film of aluminum and tantalum as major constituents, which has a large dielectric constant ($\epsilon r$), a large breakdown field (Eb) and a small leakage current. The above-mentioned composite oxide thin film is formed by sputtering a composite target of tantalum or tantalum oxide and aluminium or aluminium oxide as major constitutents.

When the above-mentioned composite target is constituted with tantalum and aluminum, a completely oxidized composite oxide thin film is obtained if the reactive sputtering is performed in an inert gas containing more than 10% oxygen.

Denote the number of tantalum atoms as x and the number of aluminum atoms as y in the sputtered composite oxide thin film. Then, it is desirable that $x/x+y$ takes a value of those ranging form 0.2 to 0.7. It was found that anealing with a temperature above 300° C. improved the characteristics further.

If the sputtered composite oxide thin film according to this invention is used as a dielectric thin film constituting a thin film condenser, the thin film condenser having a large capacitance and a stable dielectric characteristic can be obtained.

If the sputtered composite oxide thin film is used as a gate insulation film between the semiconductor layer and the gate electrode which constitute a thin film transistor, a characteristic with a large gm and a small leakage current can be obtained. Therefore, a thin film transistor with an on-off ratio of current can be obtained. Especially, if the semiconductor layer is cadmium selenide (CdSe), the interface characteristic is good and the transistor characteristic is stable with little temporal variation.

When the sputtered composite oxide thin film according to this invention is provided on both sides or on one side of a phosphor thin film constituting a thin film light emitting element, a high electric field can be applied efficiently to the phosphor thin film. Thus, a thin film light emitting element having a high brightness and capable of being driven with a low voltage can be obtained. If this phosphor thin film is a light emission layer composed of zinc sulfide containing a luminescent activator as a major constituent, one can obtain a thin film light emitting element which has a specifically high brightness by applying alternating voltages but is hard to cause breakdown. With use of at least one kind selected as the luminescent activator from a group of Mn, Cu, Ag, Al, Tb, Dy, Er, Pr, Sm, Ho, Tm and their halides, thin film light emitting elements with various light colors can be constituted.

In an EL display device of matrix type wherein a display cell for one picture element comprises a switching transistor, a storage condenser whose one electrode is connected to the source electrode of the switching transistor, and a power transistor whose gate electrode is connected to the source electrode of the switching transistor and whose source electrode is connected to the other electrode of the storage condenser; if at least one layer of the above-mentioned sputtered composite oxide thin film is provided, it can be used as a gate oxide film for the above-mentioned switching transistor and power transistor or as a dielectric thin film of the storage condenser. For the same reason as the above-mentioned one, the characteristic of each thin film element can be improved and as a whole a stable thin film integrated device with a high reliability can be obtained.

BEST MODE FOR CARRYING OUT THE INVENTION

Figure 1:
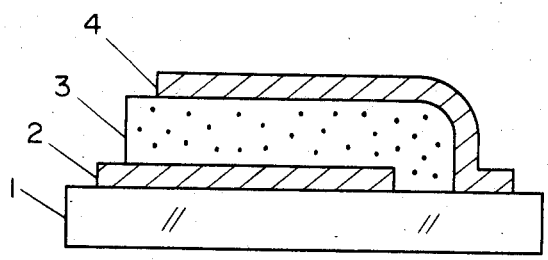
FIG. 1 is a cross-sectional view showing one example of thin film condensers used in the thin film integrated device of this invention.

FIG. 1 shows one form of embodiments of a thin film condenser in a thin film integrated device using a sputtered composite oxide thin film according to this invention.

In this device, an electrode 2 is provided on one surface of a supporting substrate wherein an insulation film is formed on the surface of an insulator such as glass or an electric conductor such as metal. This electorde 2 is aluminum having a film thickness of the order of 100 nm and formed by a vacuum evaporation method, etc. On this electrode, a sputtered composite oxide thin film with a film thickness of the order of 500 nm is formed of tantalum and aluminum as major components as a dielectric thin film 3. Further, on this dielectric thin film 3, an electrode 4 is provided. This electorde 4 is an aluminum layer with a film thickness of the order of 100 nm similar to the electrode 2, and is formed by a vacuum evaporation method, etc. The dielectric thin film 3 was formed by the reactive sputtering of a composite target comprising tantalum and aluminum plates in an inert gas containing oxygen. Ratio of oxygen was 25%, and a radio frequency magnetron sputtering was done in an atmosphere of $4.0 \times 10^{-3}$ Torr. According to this method, a sputtered composite oxide thin film of any component-combination ratio can be formed with a good reproducibility by varying the area ratio of tantalum and aluminum in the composite target.

The effect of the sputtered composite oxide thin film in this invention will be explained by the dielectric characteristic of the thin film condenser formed in the above example.

Figure 2:
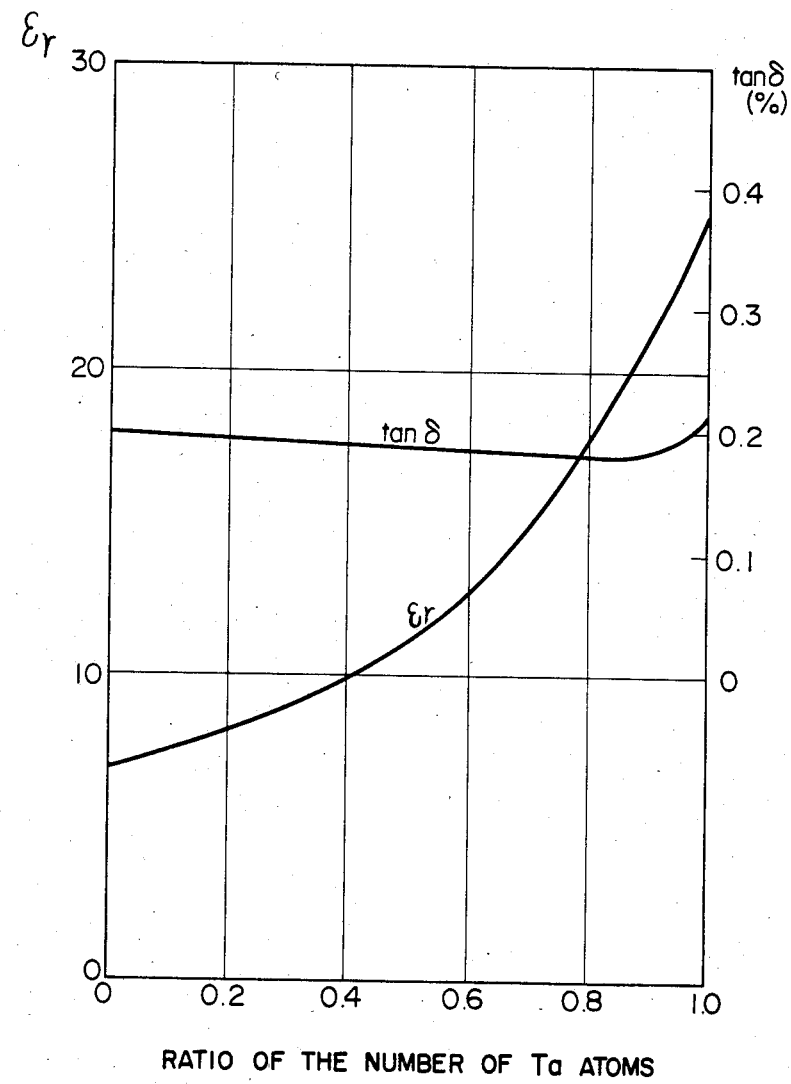
FIG. 2 is a diagram showing the relations of the dielectric constant ($\epsilon r$) and the dielectric loss (tan $\delta$) against the ratio of the number of tantulum atoms in a composite oxide thin film.

FIG. 2 shows the relations of the dielectric constant ($\epsilon r$) and the dielectric loss (tan $\delta$) against the ratio of tantalum atoms (the value of $x/x+y$ where the number of tantalum atoms is denoted by x and that of aluminum atoms by y) of the sputtered composite oxide thin film. The ratio of tantalum atoms was measured by EDX. As aparent from FIG. 2, it is possible to select $\epsilon r$ freely from 7 to 25. By an appropriate choice of the ratio of the number of tantalum atoms, a sputtered composite oxide thin film with a large $\epsilon r$ can be obtained. On the other hand, tan $\delta$ is about 0.2% and varies scarecely. The film has an excellent dielectric characteristic.

Figure 3:
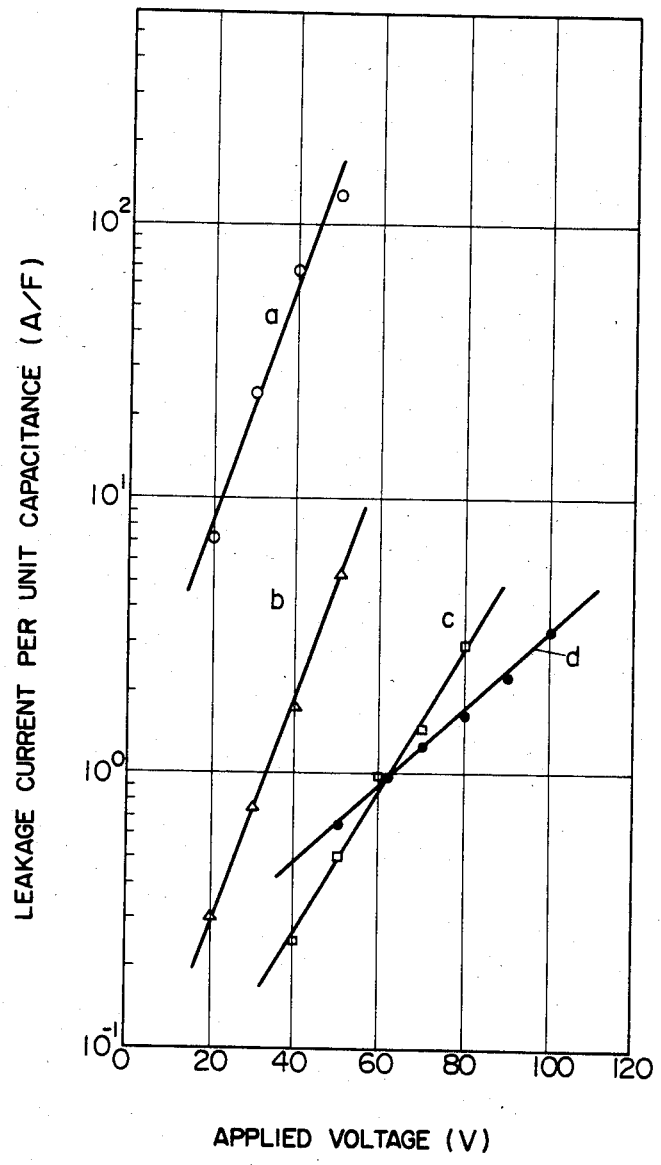
FIG. 3 is a diagram showing the leakage current per unit capacitance against the applied voltage when the ratio of the number of tantalum atoms is varied.

FIG. 3 shows the relation between the leakage current per unit capacitance and the applied voltage when the ratio of the number of tantalum atoms in the sputtered composite oxide thin film is varied. Solid lines a, b, c, d in the figure denote measured results when the ratio of the number of tantalum atoms is 1.00, 0.84, 0.37, 0.00 respectively. As aparent from FIG. 3, the leakage current per unit capacitance of the composite oxide thin films (b, c) is extremely smaller in comparison with that of tantalum oxide (a). In the case of (c), the leakage current per unit capacitance becomes smaller than that (d) of aluminum oxide only if the applied voltage is below 60 V because the dielectric constant ($\epsilon r$) is larger.

Figure 4:
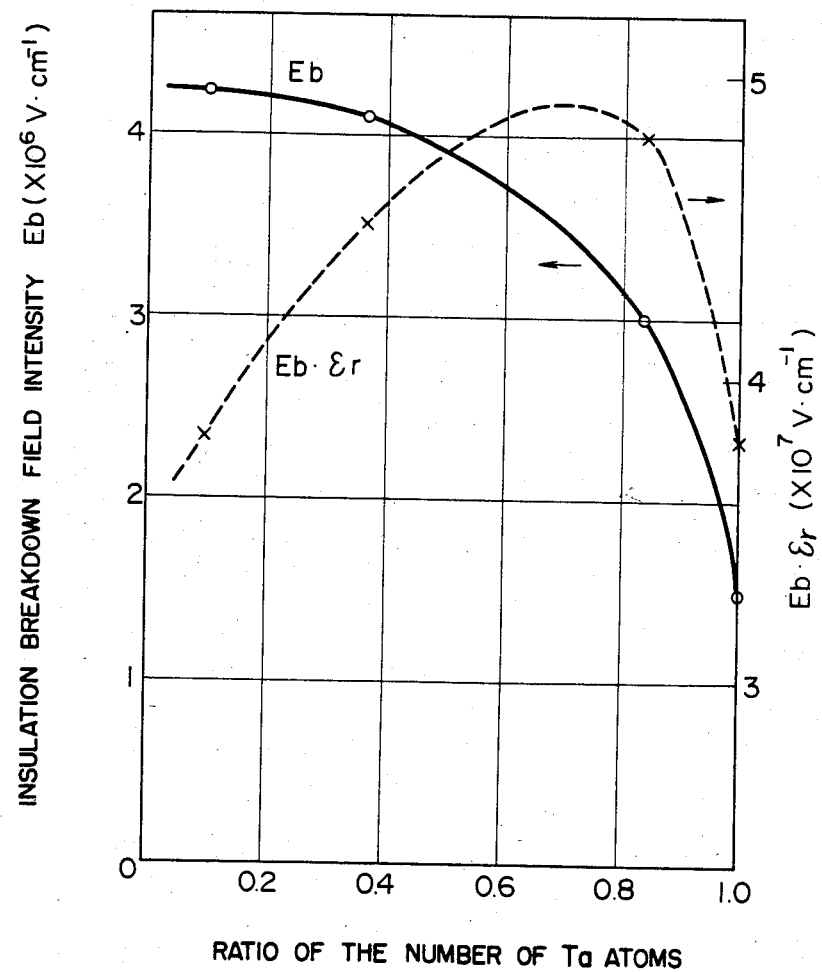
FIG. 4 is a diagram showing the relations of the breakdown field intensity (Eb) and the product of Eb and dielectric constant ($\epsilon r$), (Eb.$\epsilon r$), against the ratio of the number of tantalum atoms in the sputtered composite oxide thin film.

FIG. 4 shows the relations of the breakdown field intensity (Eb) and the product of Eb and the dielectric constant ($\epsilon r$), (Eb.$\epsilon r$), against the ratio of the number of tantalum atoms in the sputtered composite oxide thin film. As aparent from FIG. 4, it is seen that when the ratio of the number of tantalum atoms in the composite oxide thin film is decreased, that is, the ratio of the number of aluminum atoms is increased, Eb increases.

In the composite oxide thin film formed by the sputtering method, the material for the underlying electrode can be selected freely. For example, if a low resistivity thin film of aluminum, etc. is used, it is possible to decrease the dielectric loss (tan $\delta$) even at high frequencies thereby to widen the practical frequency band. Furthermore, since the sputtered composite oxide thin film in the neighborhood of the interface of the underlying electorde is perfectly oxidized, the film has characteristics: breakdown field intensity (Eb) is large and the leakage current is small.

Further, it was found that the sputtered composite oxide thin film in this invention has a strong force of attachment with electorde materials (ITO, aluminum, etc.) and an excellent water-proof property.

It is seen from FIG. 4 that when the ratio of the number of tantalum atoms in the sputtered composite oxide thin film is varied from 0.2 to 0.95, Eb.εr increases and a film with a large dielectric constant (εr) and a large breakdown field intensity (Eb) can be obtained. Since it is known that the leakage current is sufficiently small when the ratio of the number of tantalum atoms is less than or equal to 0.7, we can see that the best film can be obtained if the ratio of the number of tantalum atoms is ultimately from 0.2 to 0.7.

The leakage current of this sputtered composite oxide thin film was measured by varying the annealing temperature. The leakage current became constant to a value less than one tenth of the value before annealing, if the annealing was done with a temperature above 300° C. Thus it has been identified that the characteristics of the sputtered composite oxide thin film usable in the present thin film integrated devices can be much improved by annealing at a temperature higher than 300° C.

Although the above example has been explained of a composite oxide thin film formed by the reactive radio frequency magnetron sputtering method, a similar effect was obtained with the composite oxide thin film obtained by various sputtering methods such as the d.c. sputtering method and the ion beam sputtering method.

Figure 5:
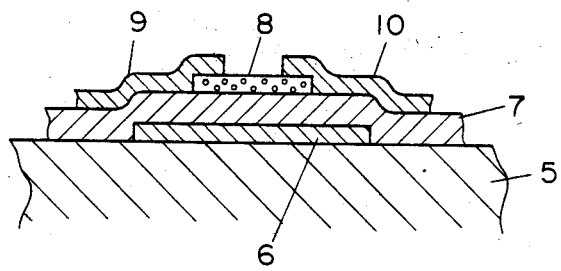
FIG. 5 is a cross-section showing one example of thin film transistors used in the thin film integrated device of this invention.

FIG. 5 shows another embodiment where this composite oxide thin film is applied to a thin film transistor. On an insulating support substrate 5 of glass, a gate electrode 6 of aluminum having a film of the order of 100 nm was formed and thereon a composite oxide thin film with a film thickness of the order of 500 nm was formed as a gate insulation film 7 by the radio frequency magnetron sputtering method. Further, on this composite thin film, a semiconductor layer 8 and thereon source and drain electrodes of aluminum 9 and 10 with a film thickness of the order of 10 nm were formed. Since the gate insulation film of this thin film transistor is the sputtered composite oxide thin film having the characteristics as mentioned above, the mutual conductance (gm) becomes larger than in the prior art. Therefore, the on-current becomes large while the gate leakage current becomes small, so that a characteristic with a small off-current was obtained. The on-off ratio of current became above 10000 when the gate voltage was varied from 0 V to 20 V.

Figure 6:
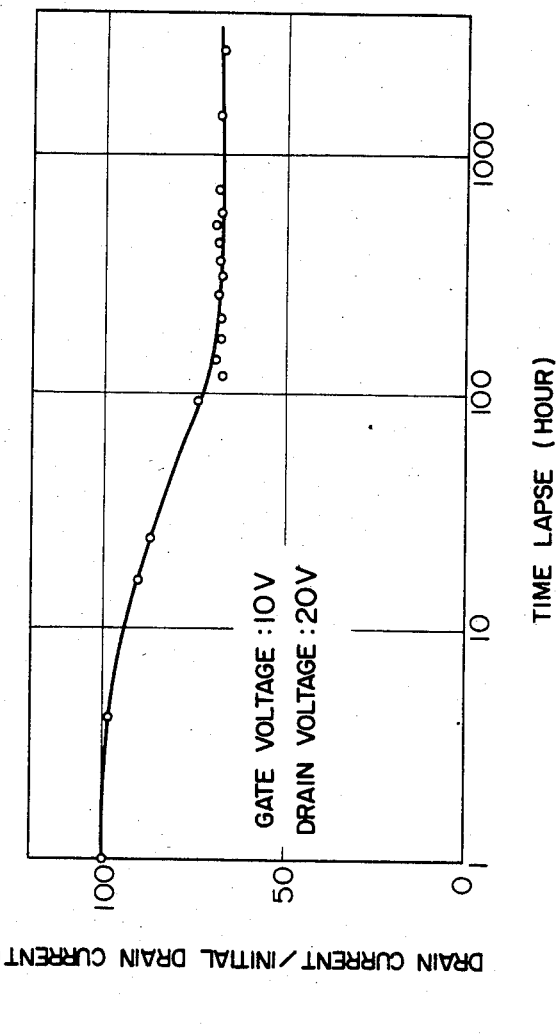
FIG. 6 is a diagram showing the temporal variation of the drain current of a thin film transistor used in the thin film integrated device of this invention.

When cadmium selenide (CdSe) with a film thickness of the order of 50 nm is used as the semi-conductor layer 8, the characteristic of the interface between CdSe and the sputtered composite oxide thin film was good. A stable thin film transistor with a small temporal variation of drain current as shown in FIG. 6 was obtained. Here, both the gate voltage and the drain voltage were kept constant at 10 V.

Figure 7:
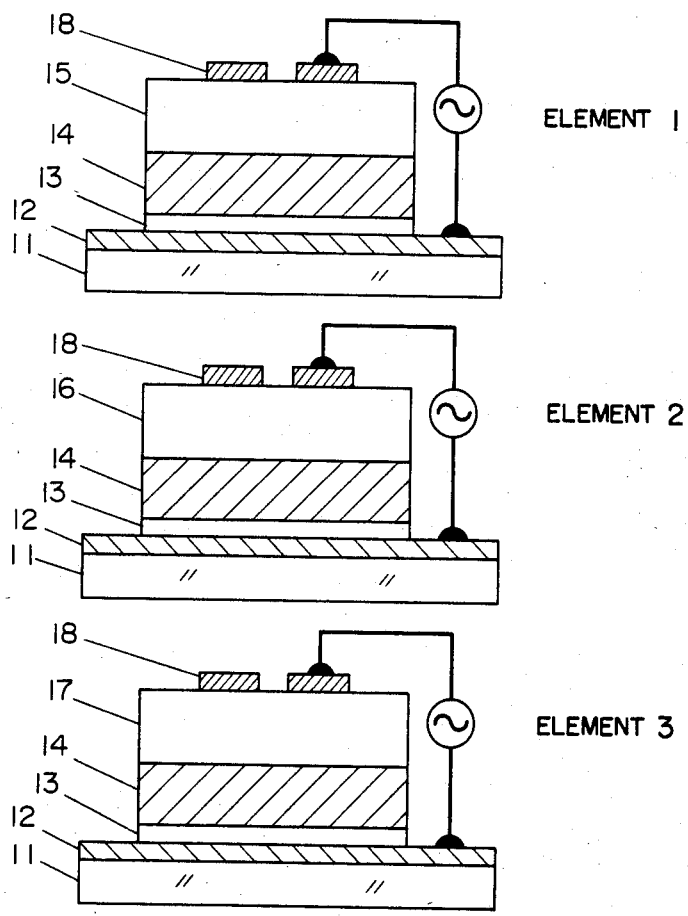
FIG. 7 shows cross-sections of thin film light emitting elements used in thin film integrated devices of the prior-art and of this invention.

FIG. 7 shows an embodiment where this sputtered composite oxide thin film is used as a thin film light emitting element. On an insulating support substrate 11 of glass, a transparent electrode 12 of indium tin oxide (ITO) with a film thickness of the order of 100 nm and thereon an insulation layer 13 of $Y_2O_3$ with a film thickness of the order of 50 nm were evaporated by an electron beam. On this layer, a phosphor layer 14 of ZnS: Mn with a film thicknes of the order of 200 nm was evaporated by an electron beam. Thereafter, a heat treatment was done for one hour in vacuum at 600° C. The element was divided into three elements. On a first element 1 and a second element 2 of them, an insulating layer 15 of tantalum oxide and an insulating layer 16 of aluminum oxide having a film thickness of the order of 300 nm were formed by the radio frequency magnetron sputtering method, respectively. On the other hand, on the third element 3 an insulating layer 17 of the composite oxide film of this invention with the ratio of the number of tantalum atoms 0.7 was formed by the radio frequency magnetron sputtering method. Finally, aluminum electrodes 18 for light reflection with a film thickness of the order of 100 nm were vacuum-evaporated.

Figure 8:
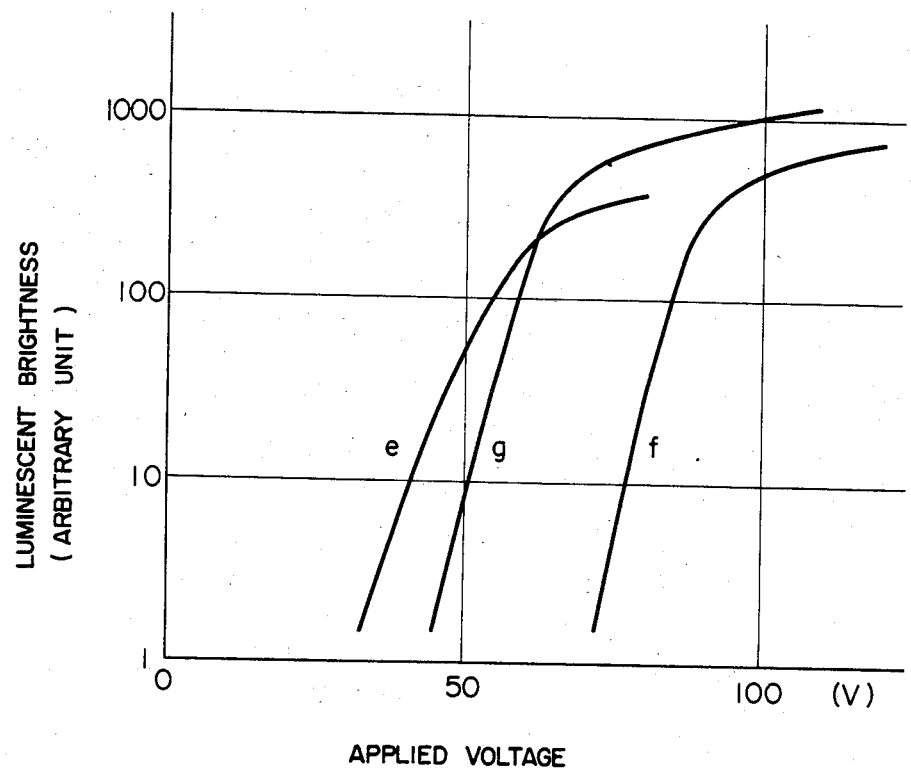
FIG. 8 is a diagram showing the characteristic of applied voltage-luminescent brightness obtained when the thin film light emitting element shown in FIG. 7 was driven by a sinusoidal wave of 5 KHz.

The above three elements were driven by applying a sinusoidal voltage with a frequency of 5 KHz. The luminescence brightness became as shown in FIG. 8. In this figure, e, f, g correspond to the element 1, element 2, element 3 respectively. The figure shows that, in the case of tantalum oxide of the element 1, the luminescence brightness cannot be increased. This is because the breakdown voltage (Eb) is small and hence no high electric field can be applied. In the case of the aluminum oxide of element 2, the driving voltage is high. It is seen that in the case of the element 3 with the sputtered composite oxide thin film, since the driving voltage is low and the breakdown voltage is increased, a high brightness is obtainable.

Although the above explanation has been made of the case of a device having a structure where an insulating layer is provided on both sides of a phosphor layer and the sputtered composite oxide thin film of this invention is provided only on the upper side insulating layer, a similar effect was obtained with a case where it is provided on both sides or one side of the phosphor layer.

Although the above example has been explained of a case where the luminescent activator is Mn, a similar effect was obtained if it is at least a kind selected from a group of Cu, Ag, Al, Tb, Dy, Er, Pr, Sm, Ho, Tm and their halides.

Figure 9A:
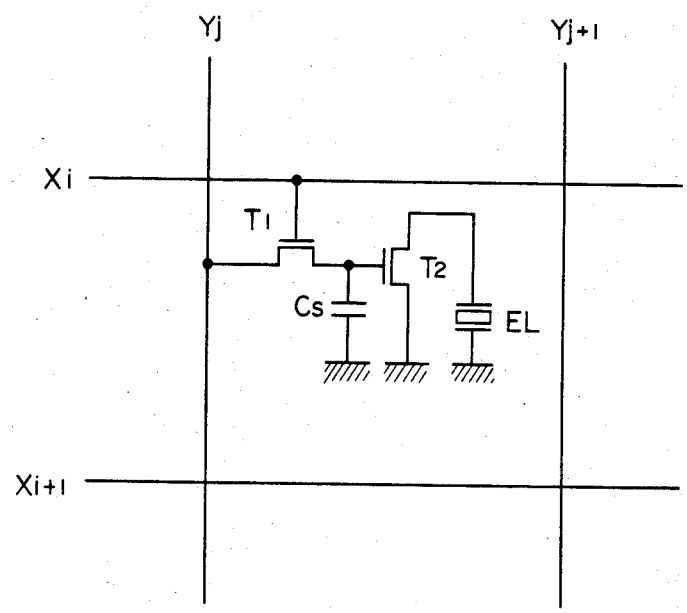
FIGS. 9 (a), and 9 (b) show the circuit diagram of one picture element and one embodiment of a case where the thin film integrated device of this invention is an EL display device of a matrix type.
Figure 9B:
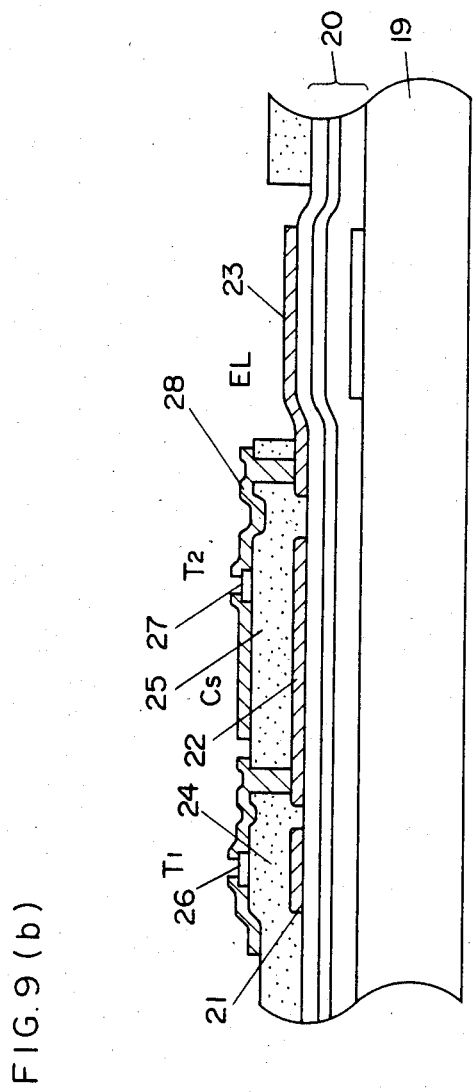

FIG. 9 (a) shows the circuit diagram of one picture element for a case where the thin film integrated device of this invention is an EL display device of matrix type. Namely, one picutre element is constituted with a switching transistor $T_1$, a storage condenser Cs, a power transistor $T_2$ and an EL element. Scanning lines $X_i, X_{i+1} \ldots$ and signal lines $Y_j, Y_{j+1}, \ldots$ intersect with one another. In order to make the electrodes intersect in X and Y directions, it is necessary to have a definite electric insulation between both electrodes. The sputtered composite oxide thin film formed simultaneously with the formation of the above-mentioned thin film element can be used as an electric insulating layer between the thin films of X electrodes and Y electrodes.

FIG. 9 (b) shows a cross-section of one embodiment of the above-mentioned EL display device of matrix type. On EL layer 20 is provided on an insulating substrate 19 of glass, etc. by the above-mentioned method. On the layer, aluminum layers with a film thickness of the order of 100 nm are formed as the gate electrode 21 of a switching transistor $T_1$, as one side electrode of a storage condenser Cs and gate electrode 22 of a power transistor $T_2$ and as the light reflecting electrode 23 of the EL layer by using the vacuum evaporation method and the photolithographic technique. On the aluminum layers, a composite oxide thin film of this invention with a film thickness of the order of 500 nm is provided by the radio frequency magnetron sputtering method. Patterning is performed by using the photolithographic technique to form a gate insulating film 24 of $T_1$ and a layer 25 which is a dielectric thin film layer of Cs and the gate insulating film of $T_2$. On these films, semiconductor layers 26, 27 of $T_1$, $T_2$ are provided. Finally provided are electrode layers 28 of aluminum with a film thicknessof the order of 100 nm, which are the source and drain electrodes of $T_1$, $T_2$, and the one side electrode of $C_5$.

In the EL display device of the matrix type thus obtained, since the various characteristics of $T_1$, $T_2$, Cs are excellent as described above, one can obtain a stable EL display device of the matrix type.

Although, in this device, only one layer of the sputtered composite oxide thin film has been used, similar effect could be obtained even when the structure has a plurality of layers or the layer was used for the dielectric thin film layer of the EL layer 20.

Further, when the sputtered composite oxide thin film of this invention is used in a liquid display device of active matrix type, a similar effect could be obtained.

INDUSTRIAL APPLICABILITY

As described above, this invention uses an oxide thin film of tantalum and aluminum as major components formed by the sputtering method as a composite oxide thin film. By applying this film in thin film elements, a thin-film integrated device can be realized wherein one kind or various kinds of thin film elements such as large capacitance thin film condensers, thin film transistors with a large on/off ratio and thin film light emitting elements with a high luminescence brightness, etc. are integrated. Since the operation characteristic and reliability of the thin-film integrated device can be improved largely, the practical value is large.

We claim:

1. A thin film integrated device wherein at least one thin film element is supported on an insulating substrate, characterized in that said thin film element includes a sputtered composite oxide thin film comprising major constituents of at least tantalum and aluminum.

2. A thin film integrated device according to claim 1, characterized in that $x/(x+y)$ is from 0.2 to 0.7 where x is the number of tantalum atoms and y is the number of aluminum atoms in the sputtered composite oxide thin film.

3. A thin film integrated device according to claim 1, characterized in that said thin film element is at least one of a thin film condenser, a thin film transistor and a thin film light emitting element.

4. A thin film integrated device according to claim 1, characterized in that said thin film element is a thin film condenser where a first electrode layer, a dielectric thin film and a second electrode layer are overlaid on an insulating substrate and in that said dielectric thin film is a sputtered composite oxide thin film.

5. A thin film integrated device according to claim 1, characterized in that said thin film element is a thin film field effect type transistor constituted with at least a drain electrode, a gate electrode, a source electrode, a semiconductor layer and a gate insulation film and that said gate insulation film is a sputtered composite oxide thin film.

6. A thin film integrated device according to claim 5, characterized in that said semiconductor layer is constituted with cadmium selenide (CdSe).

7. A thin film integrated device wherein a thin film field effect type transistor having at least a drain electrode, a gate electrode, a source electrode, a semiconductor layer and a gate insulation film is supported on an insulating substrate, characterized in that said gate insulating film is a sputtered composite oxide thin film of at least tantalum and aluminum as major constituents.

8. A thin film integrated device according to claim 7, characterized in that said semiconductor layer is constituted with cadmium selenide (CdSe).

9. A thin film integrated device according to claim 7, characterized in that $x/(x+y)$ is from 0.2 to 0.7 where the number of tantalum atoms is x and the number of aluminum atoms is y in the sputtered composite oxide thin film.

10. A thin film integrated device comprising a thin film light emitting element supported on an insulating substrate and having at least a pair of electrode layers, a phosphor thin film provided between these electrode layers and emitting light in response to a voltage applied between said electrode layers, and an insulation layer interposed between at least one of said electrode layers and said phosphor thin film, said device being characterized in that said insulation film is a sputtered composite oxide thin film of at least tantalum and aluminum as major constituents.

11. A thin film integrated device according to claim 10, characterized in that $x/(x+y)$ is from 0.2 to 0.7 where the number of tantalum atoms is x and the number of aluminum atoms is y in the sputtered composite oxide thin film.

12. A thin film integrated device according to claim 10, characterized in that said phosphor thin film is a light emission layer with zinc sulfide as a major constituent containing a luminescent activator.

13. A thin film integrated device according to claim 12, characterized in that said luminescent activator is of at least a kind selected from a group of Mn, Cu, Ag, Al, Tb, Dy, Er, Pr, Sm, Ho, Tm and their halides.

14. A thin film integrated device according to claim 10 and comprising a thin film condenser, first and second thin film field effect type transistors supported and disposed together with said thin film light emitting element in a matrix form on said insulating substrate, said thin film condenser having a dielectric thin film and electrodes contact with the both surfaces of said dielectric thin film; said field effect type transistors having a cadmium selenide thin film, drain and source electrodes contact with said cadmium selenide thin film, and a gate electrode disposed with interposition of a gate insulation film on part of said cadmium selenide thin film between said drain and source electrodes; said thin film light emitting element being connected between the drain and source electrodes of said first thin film field effect type transistor; said thin film condenser being connected between the source and gate electrodes thereof; further the source electrode of said second thin film field effect type transistor being connected to the gate electrode of said first thin film electric effect transistor; whereby said device defines a thin film electroluminescence element to form a visible information pattern by selectively applying a signal voltage between the gate and drain electrodes of said second thin film field effect type transistor and is characterized in that the dielectric thin film of said thin film condenser and the gate insulation film of said thin film field effect type transistors are made of sputtered composite oxide thin films of at least tantalum and aluminum as major constituents.

* * * * *